United States Patent [19]

Ulion et al.

[11] 4,414,249

[45] Nov. 8, 1983

[54] METHOD FOR PRODUCING METALLIC ARTICLES HAVING DURABLE CERAMIC THERMAL BARRIER COATINGS

[75] Inventors: Nicholas E. Ulion, Marlborough; Duane L. Ruckle, Glastonbury, both of Conn.

[73] Assignee: United Technologies Corporation, Hartford, Conn.

[21] Appl. No.: 327,377

[22] Filed: Dec. 4, 1981

Related U.S. Application Data

[62] Division of Ser. No. 109,955, Jan. 7, 1980, Pat. No. 4,321,310.

[51] Int. Cl.³ .................. C23C 11/00; C23C 13/00
[52] U.S. Cl. .................. 427/248.1; 204/129.1; 204/129.35; 427/34; 427/250; 427/328; 427/331; 427/419.7; 427/380; 427/405; 427/419.2; 427/419.3
[58] Field of Search ............. 427/34, 248.1, 250, 427/331, 328, 367, 372.2, 376.4, 376.8, 379, 380, 405, 419.2, 419.3; 428/612, 623, 629, 632, 633, 678, 926; 148/6.3, 11.5 R, 11.5 F, 31.5, 13; 204/129.1, 129.35

[56] References Cited

U.S. PATENT DOCUMENTS

| | | | |
|---|---|---|---|
| 3,516,874 | 6/1970 | Maker et al. | 204/129.1 |
| 3,528,861 | 9/1970 | Elam et al. | 148/11.5 F |
| 3,837,894 | 9/1974 | Tucker | 428/632 |
| 3,873,347 | 3/1975 | Walker et al. | 427/405 |
| 3,890,456 | 6/1975 | Dils | 428/632 |
| 3,945,893 | 3/1976 | Ishimori et al. | 204/129.1 |
| 4,024,294 | 5/1977 | Rairden | 427/42 |
| 4,095,003 | 6/1978 | Weatherly et al. | 428/632 |
| 4,101,715 | 7/1978 | Rairden | 427/405 |
| 4,109,031 | 8/1978 | Marscher | 427/191 |
| 4,110,893 | 9/1978 | Elam et al. | 427/250 |
| 4,145,481 | 3/1979 | Gupta et al. | 427/250 |
| 4,273,824 | 6/1981 | McComas et al. | 427/250 |

OTHER PUBLICATIONS

Boone et al., "Some Effects of Structure and Composition . . . ", J. Vac. Sci. Technol. vol. 11, No. 4, pp. 641–646, Jul./Aug., 1974.
Bunshah, "High-Rate Evaporation/Deposition Processes . . . ", J. Vac. Sci. Technol. vol. 11, No. 4, pp. 814–819, Jul./Aug., 1974.
Stecuia "Effects of Compositional Changes on the Performance of a Thermal Barrier Casting System" NASA Tech. Men. 78976, 1979.
"Plasma Deposited McrAlY Airfoil & Zirconia/McrAlY Thermal Barrier Coatings" Union Carbide, 1976.
Fairbanks, "Proceedings of 1974 Gas Turbine Materials in the Marine Environment Conference" MCIC Report Jun. 1975.
Busch "Develop Sputter Deposited Granded Metal $ZrO_2$ Coating," Battelle Pacific Northwest Lab. Contract No. N00024-75-C-4333, pp. 1–23, 1976.

Primary Examiner—S. L. Childs
Attorney, Agent, or Firm—Charles E. Sohl

[57] ABSTRACT

A coated article and method for producing the coated article are described. The article is coated with a system which provides protection against oxidation and corrosion and which significantly reduces the substrate temperature. An MCrAlY layer is applied to the article to be protected and a columnar grain ceramic is applied by vapor deposition to the MCrAlY coated article. An alumina layer which exists between the MCrAlY layer and the columnar ceramic layer provides for the adherence of the columnar layer to the MCrAlY layer. An important feature of the invention is that the interface between the MCrAlY layer and the alumina layer has a low surface roughness and this greatly improves the columnar ceramic layer adherence.

12 Claims, 2 Drawing Figures

360 X

METHOD FOR PRODUCING METALLIC ARTICLES HAVING DURABLE CERAMIC THERMAL BARRIER COATINGS

This is a division of application Ser. No. 109,955 filed on Jan. 7, 1980, now U.S. Pat. No. 4,321,310.

TECHNICAL FIELD

This invention is concerned with the field of ceramic coatings on metal substrates. The coating and method described in the present application are useful for the application of protective ceramic thermal barrier coatings to gas turbine engine components. Through the use of the present coating, substantial increases in turbine operating temperatures may be possible.

BACKGROUND ART

This application is similar in some respects to U.S. Ser. No. 109,956, now U.S. Pat. No. 4,321,311 (Columnar Grain Ceramic Thermal Barrier Coating) by T. Strangman filed on even date herewith.

The superalloy art has long sought to combine the properties of ceramics with the properties of metals. Thus for example, many attempts have been made to provide protective ceramic coatings to metal articles which find application at elevated temperatures so as to combine the thermal properties of ceramics with the ductility of metals.

The primary problem which has not been successfully solved heretofore is that the substantial difference in the coefficient of thermal expansion of metals and ceramics invariably leads to failure of ceramic coatings under conditions of severe thermal cycling.

One approach which has been employed in an effort to overcome this problem is that of grading the coating from essentially all metal at the metal surface to all ceramic at the outer surface of the coating. In this way it is believed that the coefficient of thermal expansion will change gradually through the coating thickness and the stress resulting from thermal cycling will not be sufficient to cause damage to the coating. Such an approach is described in U.S. Pat. No. 3,091,548 to Dillon. The problem with the graded approach is that the discrete metal particles in the graded coating oxidize and increase in volume producing unacceptable stresses in the coating.

In the general area of metal-ceramic combinations, it is known to use segmented ceramic pieces such as tiles which are bonded to metal structures for their protection. In this approach, which is generally applied to large articles, the segments are not bonded to each other, and the gaps between the tiles permit accommodation of the thermal expansion of the metal. Such an approach (the application of individual segments) would not be practical in the case of gas turbine engine components in which extreme operating conditions will be encountered and which a multiplicity of small complex parts must be coated at a reasonable cost. Additionally, in the use of such a segmented ceramic approach, there still remains the problem of obtaining a good metal-ceramic bond.

In a different art area, it is known to apply coatings of ceramics and metals by vapor deposition. The general subject of vapor deposition is described in an article by R. F. Bunshah "Journal of Vacuum Science of Technology," Vol. 11, No. 4, July/August 1974. The application of ceramics by vapor deposition is employed chiefly in the semiconductor and optics industries where extremely thin coatings are used.

In vapor deposition, the article to be coated is held over a molten pool of material of appropriate composition which evaporates, and the vapor condenses on and coats the article. This process is used in a variety of applications including the application of metallic coatings to gas turbine engine parts. The application to gas turbine engine parts is described in the "Journal of Vacuum Science of Technology," Vol. 11, No. 4, July/August 1974, pgs. 641 through 646 in an article by Boone et al.

This article also describes the types of defects which can occur in vapor deposited coatings. The most significant defect described is termed a "columnar defect" in which the coating forms as columnar grains which are poorly bonded to each other. Such a structure is described as being detrimental because the exposed columnar surface greatly increased the surface exposed to the environment and because the gaps between the columns may adversely affect mechanical properties. The article indicates that practical uses of vapor deposited coatings requires that the columnar type of structure be minimized.

A paper entitled "High Rate Sputtered Deposition of Protective Coatings on Marine Gas Turbine Hot Section Superalloys," authored by J. Fairbanks et al was presented in July 1974 at a conference on "Gas Turbine Materials in the Marine Environment" and was subsequently presented as a report by the Metals Information Center of the Department of Defense (MCIC 75-27). The paper indicates that columnar growth defects were observed at sputtered ceramic coatings. The paper hypothesizes that a coating with a columnar structure might permit stress relaxation of the coating and thereby enhance coating life.

Subsequent development of this concept by one of the authors is detailed in NASA Report NASA-CR-159412 issued July 19, 1978. This report describes the sputter deposition of zirconia based columnar coatings on copper substrates. The investigation was not successful in producing a coating which could withstand cycling between $-196°$ F. and $400°$ F. The investigators also performed experiments in which a titanium interlayer was deposited prior to the ceramic deposition. However, the resultant coatings spalled under conditions of moderate thermal cycling. In the conclusion of the report, the investigator indicated that the coating performance was substantially less than that observed in previous work using graded coatings. The same investigator also performed work for the Naval Sea Systems Command on graded metal-ceramic coatings applied by sputtering in which columnar coatings were produced. These coatings were unsuccessful in resisting spalling under conditions of severe thermal cycling. The report is entitled "Develop Sputter Deposited Graded Metal $ZrO_2$ Coating Technology for Application to Turbine Hot Section Components," Contract No. N00024-75-C-4333, Oct. 11, 1976.

Ceramic coatings have also been applied by a plasma spray process. The most successful plasma spray coatings to date have been applied to articles which have been previously coated with a metallic bond coat. Among the bond coats investigated have been the MCrAlY class of materials. In this situation, the bond coat appears to function by acting as a soft, rough layer in which the plasma spray particles are embedded forming a mechanical bond. This is described in U.S. Pat.

No. 4,055,705 and pending application U.S. Ser. No. 811,807 (now U.S. Pat. No. 4,248,940) which pending application has been the prevailing application in Interference No. 100,011.

DISCLOSURE OF INVENTION

The present invention includes a composite coating system which protects metallic articles from environmental damage especially under conditions of high temperature. The novel application method also forms a part of the present invention.

The article to be protected is supplied with a uniform adherent MCrAlY layer. On this MCrAlY layer, there is applied a ceramic coating having a particular novel columnar microstructure.

The ceramic coating is comprised of many individual columnar segments which are firmly bonded to the article to be protected, but not to each other. By providing gaps between the column segments, the metallic substrate may expand without causing damaging stresses in the ceramic.

The ceramic coating is applied by a vapor deposition process. A continuous alumina layer is present between the MCrAlY component and the columnar ceramic coating. This alumina layer plays a crucial role in bonding the ceramic coating to the MCrAlY layer.

A significant feature of the present invention is that the interface between the MCrAlY layer and the alumina layer is polished so as to have a low surface roughness and this polished interface is shown to provide substantial improvements in coating performance.

BRIEF DESCRIPTION OF DRAWINGS

The details of the invention will be described along with the accompanying drawings.

BEST MODE FOR CARRYING OUT THE INVENTION

Figure 1:
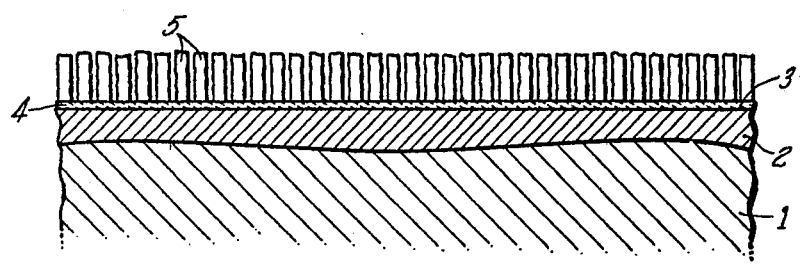
FIG. 1 is a cross sectional drawing showing the invention coating.

The thermal barrier coating system of the present invention is a composite coating which includes three interrelated elements which perform different functions. The performance of the coating system is superior to that of any other known high temperature coating when evaluated in gas turbine engine environments. The invention coating system provides oxidation and corrosion protection equal to that of best current coatings in combination with significant thermal barrier or insulating capabilities. The major use of the invention coating is in the protection of superalloy articles. Superalloys are nickel, cobalt, and iron base alloys which have exceptional properties at elevated temperatures. Typical compositions are listed in Table 1.

TABLE 1

|          | Cr | Co  | Al  | Ti  | Mo  | W    | Ta  | Cb  | V   | C   | Fe  | Ni  |
|----------|----|-----|-----|-----|-----|------|-----|-----|-----|-----|-----|-----|
| IN 100   | 10 | 15  | 5.5 | 4.7 | 3.0 | —    | —   | —   | 1.0 | .18 | —   | Bal |
| MAR M200 | 9  | 10  | 5.0 | 1.0 | —   | 12.5 | —   | 1.0 | —   | .15 | —   | Bal |
| MAR M509 | 24 | Bal | —   | .2  | —   | 7    | 7.5 | —   | —   | .6  | 1.0 | 10  |
| WI 52    | 21 | Bal | —   | —   | —   | 11   | —   | 2   | —   | .45 | 2   | —   |

The invention thermal barrier coating has a major use in gas turbine engines and was developed with this application in mind. However, there are many other potential applications for which this coating or some variation thereof would be well-suited.

The coating consists of a metallic layer of a MCrAlY alloy, having a polished surface, a continuous adherent alumina layer (formed in situ) on the metallic layer and a discontinuous pure ceramic layer of a particular columnar morphology on the alumina layer.

The metallic layer is comprised of a MCrAlY alloy. Such alloys have a broad composition of 10 to 30% chromium, 5 to 15% aluminum, 0.01 to 1% yttrium (or hafnium, lanthanum, cerium and scandium) and a balance (M) selected from the group consisting of iron, cobalt, nickel and mixtures thereof. Minor amounts of other elements may also be present. Such alloys are known in the prior art for use alone as a protective coating and are described in various U.S. Pat. Nos. including 3,542,530; 3,676,085; 3,754,903 and 3,928,026 which are incorporated herein by reference.

This invention also contemplates the use of various interlayers between the superalloy substrate and the MCrAlY layer. In particular, it is known from U.S. Pat. No. 4,005,989 that the use of an aluminide layer (produced by aluminizing) between a substrate and a MCrAlY layer can provide improved coating durability. Other materials such as platinum have also been proposed for interlayer use. Of course, such interlayers will be used only where necessary and only where they do not adversely affect the bond between the substrate and the MCrAlY.

It is preferred that this MCrAlY layer is applied by vapor deposition. Such a deposition process in combination with peening and heat treating provides a dense adherent layer of relatively uniform thickness which is basically free from defects. A thickness of 1–10 mils is suitable. A key feature of the invention is that the MCrAlY surface is treated, by polishing or the like, to have a very smooth finish.

Other deposition processes may be employed for producing the MCrAlY layer including sputtering and plasma spraying, possibly with associated post coating treatments, so long as they produce a uniform thickness high integrity coating of the desired composition which has or can be treated to have a polished surface.

The alumina layer on the MCrAlY layer is produced by oxidation of the MCrAlY layer. This oxide layer is relatively thin (0.01–0.1 mil), uniform and adherent. As a result of the smooth surface finish on the MCrAlY the oxide layer will also be smooth. Adherence of the oxide layer is greatly improved in MCrAlY alloys compared to that of similar alloys which do not contain yttrium or similar active elements. This improved adherence results from the formation of yttrium oxides which extend into the MCrAlY and are bonded to the alumina surface layer thus anchoring the surface layer and minimizing spalling.

The adherence of the alumina layer is essential to the adherence of the columnar ceramic layer and the presence of yttrium or equivalent oxygen active elements such as lanthanum, cerium, hafnium, and scandium or mixtures of oxide particles thereof, in the metallic coating is important to the proper functioning of the invention coating system.

The final component of the thermal barrier coating is a unique columnar grain ceramic surface coating which is tightly bonded to the alumina layer. The columnar grains are oriented substantially perpendicular to the surface of the substrate with free surfaces between the individual columns extending down to the aluminum oxide layer.

The ceramic surface layer is a pure ceramic as distinguished from some prior art which has suggested the use of a graded layer incorporating substantial amounts of metal in the coating.

The columnar nature of the surface layer circumvents the difference in the coefficients of thermal expansion between the substrate and the coating which is believed responsible for failure in prior art ceramic thermal barrier coatings. Upon heating, the substrate expands at a greater rate than the ceramic surface coating and the columnar boundaries between the individual ceramic columns open to accommodate mismatch strains. This reduces the stress at the interface between the substrate and the columnar ceramic to a level below that which will produce a fracture of a columnar surface layer. The columns have dimensions on the order of 0.1 mil in cross section. We have found that by polishing the MCrAlY surface, prior to oxidizing the surface, surprising and unexpected improvements in adherence of the columnar ceramic layer may be achieved.

The columnar surface layer may be one of many ceramic compositions. Most of the experimental work to date has been performed with a ceramic composed of cubic zirconia stabilized by the addition of either 20 or 35% yttria.

It is difficult to specify exactly the characteristics required in the ceramic material used as the columnar coating. It appears that there should be some degree of solid solubility between the columnar ceramic material and alumina. This is believed to be the major criteria which most affects the adherence of the columnar ceramic coating to the alumina layer. Other characteristics are also necessary. The columnar ceramic material should not form low melting compounds (e.g. eutectics) when in contact with alumina at elevated temperatures. The melting point (and sublimation point) of the columnar ceramic material should be substantially greater than the service temperature.

Finally, the columnar ceramic material should be stable in the intended environment; i.e., the material should not oxidize or otherwise react with the environment to any significant extent (some ceramics such as $Si_3N_4$ will oxidize at elevated temperatures but the oxidation is self limiting since the oxidize produced ($SiO_2$) protects against further oxidation). The following ceramics are believed to have utility as the columnar coating material of the present invention: zirconia (preferably stabilized with a material such as yttria) alumina, ceria, mullite, zircon, silica, silicon nitride, hafnia, and certain zirconates, borides and nitrides.

In summary, therefore, the columnar ceramic material should have some degree of solid solubility in alumina and should be stable in the intended use environment. We believe that the skilled artisan will have no difficulty in selecting an appropriate ceramic based on the previous guidelines.

The function of the MCrAlY layer is to adhere strongly to the substrate and to produce a strong adherent continuous oxide surface layer. The alumina surface layer so-produced protects the underlying MCrAlY layer and substrate against oxidation and hot corrosion and provides a firm foundation for the columnar grain ceramic surface layer.

The columnar grain ceramic surface layer reduces the temperature of the underlying substrate and coating layers. Because of the nature of many ceramics and the existence of open boundaries between the columns, the ceramic surface layer is relatively transparent to oxygen and does not play a major role in reducing the oxidation of the underlying layers except to the extent that the reduction in the temperature of the underlying layers reduces the rate of oxidation. The alumina layer on the MCrAlY is the major barrier to oxidation. Preliminary indications are that a 5 mil thick $ZrO_2$ base coating can reduce substrate temperatures by from 50° to 200° F. under conditions typical of those found in current gas turbine engines with cooled blades.

The ceramic surface layer may play a role in reducing hot corrosion by acting as a barrier between the underlying MCrAlY layer and the various liquid and solid combustion products which have been observed to cause hot corrosion. The ceramic layer is also believed to be beneficial in protecting against hot corrosion by acting to increase the rate of evaporation of surface deposits in certain circumstances as a result of the high surface temperature of the ceramic which results from its thermal insulation capabilities. As will be shown below, the provision of a polished MCrAlY surface dramatically improves the adherence of the columnar ceramic coating.

FIG. 1 shows a cross sectional view of a coating according to the present invention. The substrate material 1 is coated with an MCrAlY layer 2. This MCrAlY layer has a polished outer surface 3. On this surface 3 there is formed an adherent alumina layer 4. Finally, a columnar ceramic layer 5 adheres to the alumina layer 4.

Having described the structure of the coated article, we will now describe a preferred method of producing this coating on gas turbine components such as blades and vanes.

The initial step in the coating application sequence is the preparation of the surface to be coated. The surface must be clean of all dirt, grease, oxides and the like.

The cleaning method we have used is vapor honing which employs an aqueous abrasive slurry which is propelled against the surface to be cleaned with the sufficient force to remove all extraneous material from the surface. Following this step, the surface is preferably vapor degreased. While this is a satisfactory cleaning process, numerous alternative processes are possible so long as they produce a satisfactory cleaned surface.

Next, the MCrAlY layer is applied. It is preferred that this MCrAlY layer be applied by vapor deposition. The deposition process is performed by holding the surface to be coated over a pool of molten MCrAlY material in a vacuum chamber. The heat source used to keep the MCrAlY molten is usually an electron beam.

The surface to be coated is preferably maintained at a temperature of about 1600°–1800° F. during the MCrAlY deposition process.

It is preferred that the MCrAlY layer have a thickness of about 1 to about 10 mils. MCrAlY thicknesses below about 1 mil do not provide adequate protection to the surface (especially if the MCrAlY is subsequently polished) and thicknesses in excess of about 10 mils are prone to rippling during repeated thermal cycling.

In conventional MCrAlY practice, the coatings are dry glass bead peened to densify any voids and to improve the coating structure. Such peening is preferred, but has not been found essential, in the present invention process.

The coating is then preferably heat treated at 1975° F. in hydrogen, however, neither the time or temperature is particularly critical. We have used a 4-hour treatment to improve the adherence of the coating to the substrate.

As indicated previously, dramatic improvements in coating performance are obtained by polishing the MCrAlY surface. Such a polishing step is an important part of the invention.

The exact method employed does not appear to be significant. We have used mechanical polishing and electropolishing (electrochemical polishing) and have not observed any significant differences in the properties of the resultant coating. Other polishing techniques such as purely chemical methods may also be applicable.

Application of coatings to MCrAlY substrates having thicknesses of 35–50 RMS and 6–10 microinches RMS have shown performance improvements of over 100 times in favor of the smoother substrate. Based on this result, we prefer that the surface roughness after polishing be less than about 25 microinches RMS. Following polishing, the alumina film must be developed. We have used thermal oxidation in a hydrogen atmosphere of commercial purity at a temperature of 1975° F. with good results. Oxide development occurs as a result of oxygen impurities in the hydrogen. Oxidation in air at temperatures between 500° and 2000° F. should also be satisfactory.

By polishing the MCrAlY to reduce its surface roughness the surface roughness of the subsequently developed aluminum layer is also reduced. We believe that this improved alumina surface finish improves the perfection of the initial portion of the subsequently deposited columnar ceramic. The initial portion of the columnar ceramic consists of many small columnar grains which appear to grow in a competitive fashion with some more favorably oriented grains dominating less favorably oriented grains. Eventually, the more favorably oriented grains prevail so that the number of grains at the free surface is substantially less than the number of initially nucleated grains. By polishing the MCrAlY the perfection of the competitive growth is increased and its perfection increased. Failure of the coating occurs in the columnar layer near the alumina interface. The columnar ceramic displays greatly improved adhesion to the alumina when the alumina has a smooth surface.

The end result must be an alumina layer on a polished MCrAlY surface. Because the alumina faithfully follows the underlying surface the suface finish of the alumina will be essentially the same as the MCrAlY surface finish on which it is developed.

It also appears possible to develop the alumina layer after the deposit of the columnar grained ceramic layer. This is especially likely in the case of zirconia based ceramics which are quite transparent to oxygen. However, formation of the alumina layer prior to the columnar ceramic layer is preferred.

The exact processing sequence employed does not appear to be critical. For example, if the peening step is omitted, the parts may be polished immediately after MCrAlY deposition and then heat treated. Even if peening is employed, the parts may be polished immediately after peening and the post peening heat treatment may be combined with the alumina forming heat treatment.

Following the application of the MCrAlY layer and the development of the oxide layer, the columnar grained ceramic surface layer is applied by a vapor deposition process.

The ceramic to be deposited is melted and maintained as a molten pool or evaporation source. We have used 10–20 mesh ceramic powder as a starting material, but other starting forms are possible. The substrate to be coated is positioned over the evaporation source and is manipulated to produce a uniform coating thickness and to enhance the production of a columnar structure. The ceramic coating thickness may range from about 1 to about 50 mils.

During the ceramic coating cycle, it has been found desirable to maintain the substrate at a relatively low temperature; e.g., 1000°–1500° F. to provide a relatively coarse columnar structure and to provide a relatively stoichiometric coating composition.

In the case of oxide ceramics, the as deposited ceramic may be oxygen deficient. A heat treatment in air maybe used to achieve stoichiometry.

The coating of the invention is novel in the sense that the prior art has, in general, gone to some lengths to avoid the production of a columnar structure which has been regarded as a coating defect. This invention utilizes what has heretofore been regarded as a coating defect to provide improved coating performance.

The discovery that a polished substrate provides markedly improved properties is also contrary to what conventional wisdom might suggest. It generally assumed that rough surfaces which provide increased surface area and the possibility of mechanical locking, are better for coating adherence than are smoother surfaces.

The present invention will be more readily understood by reference to the following illustrative examples.

EXAMPLE 1

A nickel base superalloy substrate formed of alloy MAR-M-200 (nominal composition shown in Table 1) was provided with a NiCoCrAlY coating having a nominal composition of 18% chromium, 23% cobalt, 12.5% aluminum, 0.3% yttrium, balance nickel.

On one set of samples a plasma spray process was used to deposit the NiCoCrAlY. The surface roughness of the as deposited plasma spray NiCoCrAlY was 280–350 microinches RMS. Next, a similar plasma spray process was used to deposit a yttria stabilized zirconia layer 5 mils thick. The details of the ceramic deposition process and resultant layer are also within the teachings of allowed U.S. application Ser. No. 811,807. This plasma sprayed thermal barrier system is a state-of-the-art system.

A second set of samples was prepared according to the teachings of U.S. application Ser. No. 327,306 by Strangman filed on even date herewith. This preparation sequence is similar to that described in the present application except that the MCrAlY is not polished prior to the development of the alumina layer and the deposition of the columnar ceramic layer.

Figure 2:
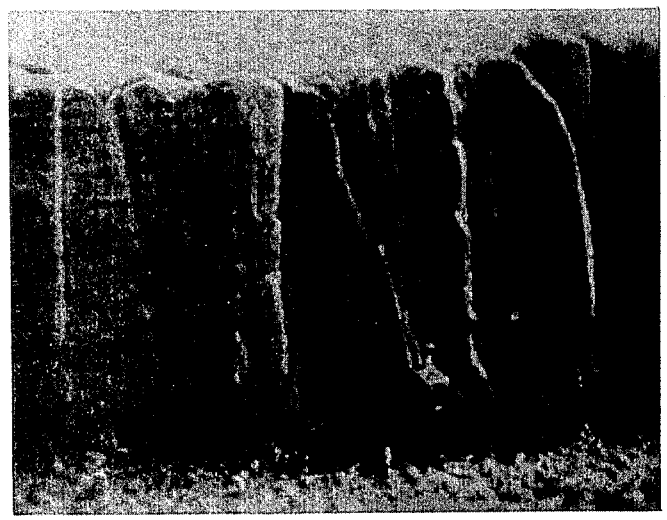
FIG. 2 is a photomicrograph which shows an experimental coating.

A superalloy substrate of MAR-M-200 was cleaned and given a 5 mil coating of NiCoCrAlY by vapor deposition. The vapor deposition was performed in vacuum chamber and the substrate was maintained at a temperature of 1500° F. during the deposition process. The NiCoCrAlY was glass bead peened and heat treated (4 hours at 1975° F.). After peening the surface roughness was 35–50 microinches RMS. During this heat treatment a thin adherent alumina layer formed on the NiCoCrAlY. On this alumina layer there was applied a 5 mil coating of yttria stabilized zirconia. This zirconia coating was applied by vapor deposition and had the columnar structure which has been previously described. The structure of the resultant coating is shown in FIG. 2. The columnar nature of the ceramic is apparent.

These samples were evaluated in a cyclic temperature burner rig. In this test, samples are mounted on a rotating platform and a flame produced by the combustion of jet fuel is impinged on the samples. A control system modulates the flame and maintains the samples at a desired temperature and can vary the temperature according to a predetermined cycle.

In the cycle used in this example, the samples were heated to 1850° F. and held to this temperature for 4 minutes. The flame was then removed and a jet of cooling air was used to cool the sample to 400° F. within 2 minutes. This cycle was repeated until signs of coating failure were observed. This cycle produces severe thermal strains on the coating system.

The samples which have been coated by plasma spraying lasted 1210 cycles in this test. The samples to which the ceramic coating has been applied by vapor deposition have withstood 29,470 cycles without failure and the test is continuing. This example demonstrates the surprising performance of a coating similar to that of the present invention even without the incorporation of a polished MCrAlY surface. The columnar ceramic coating shows about twenty times the life of the plasma sprayed coating in this test.

The next example will demonstrate the improvement which can be obtained from polishing of MCrAlY surfaces prior to surface oxidation and the application of the columnar ceramic coatng.

EXAMPLE 2

Superalloy specimens, of alloy MAR-M-200, were coated with a 5 mil thick layer of NiCoCrAly as described in the previous example. The NiCoCrAlY coated samples were then glass bead peened and heat treated. The NiCoCrAlY coating surface had a roughness of 35–50 microinch RMS. The heat treatment produced a thin adherent alumina coating on the NiCoCrAlY surface. One set of heat treated samples had a columnar grain ceramic coating applied directly to this alumina coated NiCoCrAlY surface.

The second set of samples was mechanically polished with 600 grit silicon carbide paper to reduce the surface roughness to a value of 6–14 microinch RMS. The polished NiCoCrAlY samples were heat treated to produce an alumina layer (1975° F./4 hrs./$H_2$) and a 5 mil thick coating of yttria stabilized zirconia was applied by vapor deposition under the same conditions as described in Example 1. The ceramic coating thus applied had a columnar structure which was usually indistinguishable from that shown in FIG. 2.

Both sets of samples were processed in the same fashion except for the inclusion of the polishing step in the processing of the second set of samples. Thus the second set of samples represents the present invention. These samples were tested in a burner rig of the type described in Example 1, however in this example, the test conditions were modified so as to produce substantially more severe strains on the coating during thermal cycling. The samples were heated to and held at 2100° F. for 2 minutes and forced air cooled to about 400° F. within 2 minutes to provide a much more severe test.

The samples which had not been polished prior to the application of the ceramic coating lasted only 54 cycles. In the previous example, similar samples tests with an 1850° F. cycle lasted more than 29,000 cycles and from this it can be seen that the 2100° F. cycle is a substantially more severe test of coating durability. The samples which had been polished prior to the application of the ceramic coating, lasted 7125 cycles of 2100° F. testing. This is an improvement by a factor of about 130 times over the performance of the unpolished samples.

The plasma sprayed coating in Example 1 is a state-of-the-art thermal barrier coating. By combining the relative performance of the three coatings described in the two examples, one can conclude that the columnar ceramic coating applied to a polished MCrAlY substrate has about $6 \times 10^4$ times the life of the plasma sprayed ceramic thermal barrier coating. Because of the different test conditions, this comparison is not precise, but the advantage of the present invention coating are apparent.

Although this invention has been shown and described with respect to a preferred embodiment thereof, it should be understood by those skilled in the art that various changes and omissions in the form and detail thereof may be made therein without departing from the spirit and scope of the invention.

We claim:

1. A method for producing a metallic article having a durable ceramic thermal barrier coating said method consisting essentially of:
   a. providing a superalloy substrate with a clean surface
   b. applying a thin adherent layer of MCrAlY to the clean surface
   c. polishing the MCrAlY layer to a smoothness of less than about 25 microinches RMS
   d. applying a columnar ceramic coating to the polished MCrAlY layer by vapor deposition
   e. heat treating the columnar ceramic coated article in a oxygen containing atmosphere to develop an alumina layer between the MCrAlY and the columnar ceramic coating.

2. A method as in claim 1 wherein the MCrAlY layer is applied by vapor deposition.

3. A method as in claim 1 wherein the MCrAlY layer has a thickness of about 1–10 mils.

4. A method as in claim 2 wherein the vapor deposited MCrAlY is subsequently peened.

5. A method as in claim 4 wherein the peened vapor deposited coating is subsequently heat treated.

6. A method as in claim 1 wherein the MCrAlY layer has a surface finish of less than about 20 microinches RMS after polishing.

7. A method as in claim 1 wherein the polishing step is accomplished by mechanical means.

8. A method as in claim 1 wherein the polishing step is accomplished by chemical means.

9. A method as in claim 1 wherein the polishing step is accomplished by electrolytic means.

10. A method as in claim 1 wherein the uniform adherent layer is developed by thermal oxidation.

11. A method as in claim 1 wherein the thickness of the alumina layer is about 0.01 to about 0.1 mils.

12. A method as in claim 1 wherein the article is manipulated during application of the ceramic layer so as to encourage the formation of a columnar structure.

* * * * *